US009391666B1

(12) United States Patent
Handtmann et al.

(10) Patent No.: US 9,391,666 B1
(45) Date of Patent: Jul. 12, 2016

(54) MULTIPLEXER DEVICE WITH FIRST AND SECOND FILTERING DEVICES CONNECTED TO COMMON PORT

(71) Applicant: Avago Technologies General IP (Singapore) Pte. Ltd., Singapore (SG)

(72) Inventors: Martin Handtmann, Riemerling (DE); Paul Bradley, Los Altos, CA (US); Andriy Yatsenko, Munich (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/581,650

(22) Filed: Dec. 23, 2014

(51) Int. Cl.
*H03H 9/70* (2006.01)
*H04B 1/48* (2006.01)
*H04L 7/027* (2006.01)

(52) U.S. Cl.
CPC ............... *H04B 1/48* (2013.01); *H03H 9/706* (2013.01); *H04L 7/027* (2013.01)

(58) Field of Classification Search
CPC ......... H04B 1/40; H03H 9/703; H03H 9/706; H03H 9/0571
USPC ........................ 375/219, 220; 333/133, 134
See application file for complete search history.

(56) References Cited

U.S. PATENT DOCUMENTS

| | | | |
|---|---|---|---|
| 7,339,445 B2 * | 3/2008 | Aigner et al. | 333/133 |
| 7,796,957 B2 | 9/2010 | Ruby et al. | |
| 8,193,877 B2 * | 6/2012 | Fritz et al. | 333/133 |
| 2004/0246071 A1 * | 12/2004 | Rottmoser | H01P 1/2039 333/134 |
| 2005/0174192 A1 * | 8/2005 | Kawamura | H03H 9/564 333/133 |
| 2012/0274417 A1 * | 11/2012 | Kihara et al. | 333/133 |
| 2012/0300679 A1 * | 11/2012 | Tsutsumi | 370/278 |
| 2013/0273860 A1 | 10/2013 | Pehlke | |

OTHER PUBLICATIONS

"Diplexers, Triplexers and Multiplexers", Lark Engineering Co., www.larkengineering.com, Jul. 16, 2014, pp. 52-53.
P. Bradley et al., "A 6-Port Film Bulk Acoustic Resonator (FBAR) Multiplexer for U.S. CDMA Handsets Permitting use of PCS, Cellband, and GPS with a Single Antenna", Wireless Semiconductor Division(WSD), Oct. 2006, pp. 1-4.

* cited by examiner

*Primary Examiner* — Kevin M Burd

(57) ABSTRACT

A multiplexer device includes at least one filtering device having at least one first band pass filter, connected to a common port via at least one series inductance, respectively, and only one or non-overlapping passbands, and at least one second filtering device, each of which includes at least one second band pass filter with a total of at least two second band pass filters are connected to the common port and having non-overlapping passbands, respectively. Combined series inductance transformed input impedance of the at least one first filtering device is inductive, when viewed from the common port, in the passbands of the at least two second band pass filters. Combined input impedance of the at least one second filtering device is substantially capacitive, when viewed from the common port, in a passband of the at least one first band pass filter in the at least one first filtering device.

19 Claims, 7 Drawing Sheets

MULTIPLEXER DEVICE WITH FIRST AND SECOND FILTERING DEVICES CONNECTED TO COMMON PORT

BACKGROUND

Devices operating in mobile communication systems, such as cellular telephones and other wireless devices, are configured to communicate over wireless networks. It is often necessary to connect different signal paths of a mobile communication device to a common port, such as a common antenna port. For example, a mobile communication device includes a receiver and a transmitter that are typically connected to a common antenna through the common antenna port, for sending and receiving data and control signals over the wireless network. The signal paths and/or related signal path ports must be isolated from one another. Therefore, the signal paths include filtering devices formed by one or multiple band pass filters that have passbands corresponding to the signal frequency bands of the respective signal paths. For example, a duplexer which may be formed by two filtering devices then has two signal paths (e.g., a receive path from a common antenna to a receiver and a transmit path from a transmitter to the common antenna) with two corresponding filtering devices each being a band pass filters. Accordingly, the receiver is able to receive signals through a receive frequency passband, and the transmitter is able to send transmit signals through a different transmit frequency passband, while filtering out the other frequencies. More generally, a multiplexer may have multiple signal paths connected to a common port (two or more) with corresponding filtering devices, each formed by one or multiple band pass filters.

The receive and transmit signals may be radio frequency (RF) signals, for example, corresponding to various predetermined wireless communication standards, such as such as universal mobile telecommunications system (UMTS), global system for mobile communication (GSM), wideband code division multiple access (WCDMA), and Long-Term Evolution (LTE), for example. The communication standards identify separate bands for transmitting and receiving signals. For example, LTE is allocated various 3GPP bands, including bands 1, 3 and 7, where LTE band 1 provides an uplink frequency band of 1.920 GHz-1.980 GHz and a downlink frequency band of 2.110 GHz-2.170 GHz, LTE band 3 provides an uplink frequency band of 1.710 GHz-1.785 GHz and a downlink frequency band of 1.805 GHz-1.880 GHz, and LTE band 7 provides an uplink frequency band of 2.500 GHz-2.70 GHz and a downlink frequency band of 2.620 GHz-2.690 GHz. Accordingly, a duplexer for example operating in compliance with a 3GPP standard would include a filter having a passband within the corresponding uplink frequency band, and a filter having a passband within the corresponding downlink frequency band. Further, some new communication standards, such as LTE-A, require additional connections of transmit and receive signal paths to a common antenna port, for example, to provide carrier aggregation.

In RF communications, use of a common antenna requires matching the common antenna to respective ports of the multiple signal paths in their respective passbands to optimize signal transfer. This requirement drives the need for a matching circuit at the common antenna port that connects the different signal paths and the respective filters.

For conventional duplexers, there are two dominant matching techniques: quarter-wavelength matching and shunt inductor matching. According to the quarter-wavelength matching technique, the band pass filter having a passband that is higher in frequency is connected by a quarter-wavelength transmission line to a common antenna port, and the band pass filter having a passband that is lower in frequency is connected directly to the common antenna port with no quarter-wavelength transmission line. Thereby, the higher frequency band pass filter typically features a low input impedance in the passband of the lower frequency band pass filter which is transformed by the quarter-wavelength transmission line into a high impedance. Due to the high impedance, the higher frequency band pass filter does not substantially load the lower frequency band pass filter in corresponding passband of the lower frequency band pass filter. Since the lower frequency band pass filter typically already features a high impedance in the passband of the higher frequency band pass filter, no matching element is necessary. The quarter-wavelength matching technique typically requires the two filters to be in adjacent in frequency, such that the input impedance assumptions described above are valid.

In the shunt inductor matching technique, a shunt inductor is connected at a common connection point (common port or common antenna port) of the two band pass filters having corresponding passbands. Each band pass filter typically features a capacitive input impedance in the passband of the other band pass filter, which is transformed into a high impedance by the shunt inductor. Therefore, the band pass filters do not load each other in their respective passbands. The shunt inductor matching technique is more efficient when the passbands of the two band pass filters are further apart in frequency, such that the input impedance of each band pass filter does not change significantly due to acoustics in the passband of the other band pass filter.

The shunt matching technique may also be applied to a multiplexer with three or more band pass filters connected to a common antenna. In the passband of one band pass filter, the sum of capacitive input impedances of all other band pass filters in the multiplexer is transformed into a high impedance by the shunt inductor. This condition is typically met when the passbands of the band pass filters are within a relatively small frequency band (e.g., about 20 percent of the absolute frequency). For band pass filters having passbands distributed more broadly, a degradation is usually observed since frequency dependency of the shunt inductor impedance and the capacitive input impedance of each of the band pass filters does not match, and therefore the input impedances have to be selected sub-optimally. Further, adding additional band pass filters degrades overall performance, since more energy is stored in the matching circuit, resulting in occurrence of more losses.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
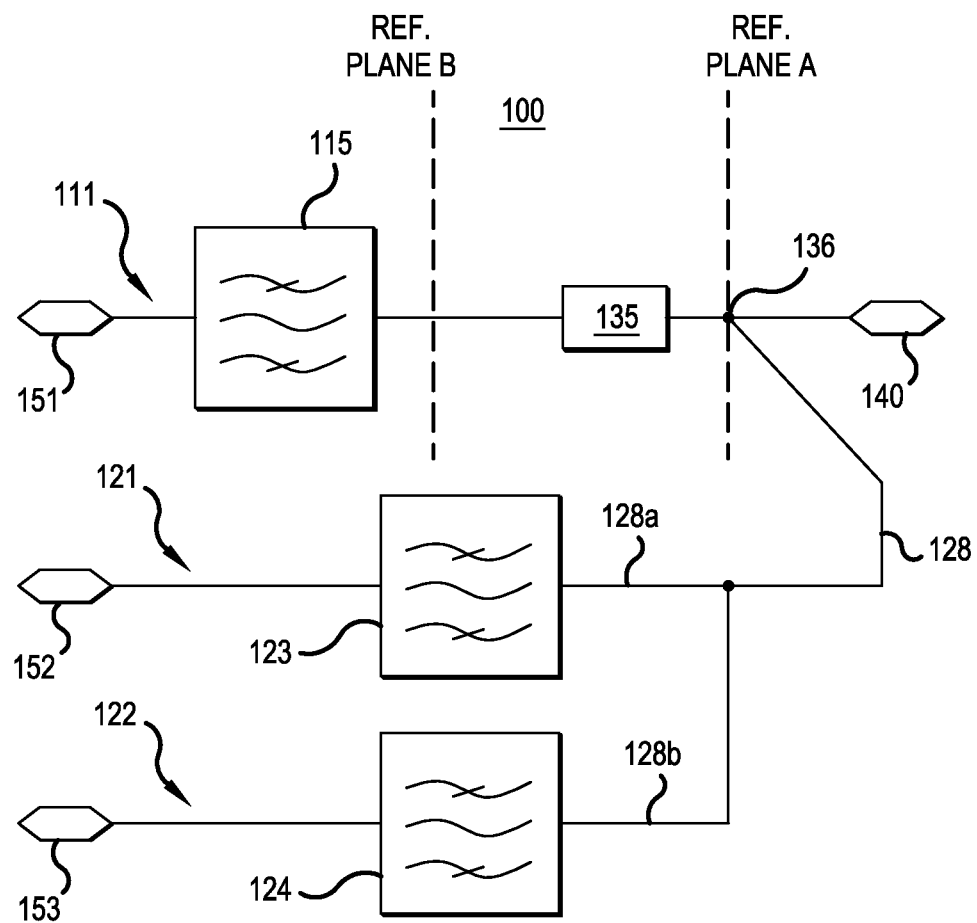
FIG. 1 is a simplified block diagram of a multiplexer device connected to a common port, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, according to various embodiments, at least two signal paths are connected to a common port, such as a common antenna port. Each of the signal paths includes a filtering device, such as a band pass filter having a corresponding passband or a multiplexer having multiple band pass filters. For purposes of discussion, a band pass filter has two ports, one on each side of the band pass filter, e.g., one input port and one output port. In comparison, a multiplexer has one port on one side and at least two ports on the other side. As a consequence, a multiplexer defines at least two signal branches from the one port on one side to the at least two ports on the other side. For the multiplexer device described herein, according to various embodiments, branching of signal branches at the common (antenna) port is referred to as a signal path, whereas for a multiplexer (forming part of the multiplexer device) in a signal path representing a filtering device, the signal branches are referred to as signal branches as opposed to signal paths. When a filtering device in a signal path is a multiplexer, that multiplexer will define at least two signal branches of the signal path, where each of the signal branches includes a corresponding band pass filter. Notably, a band pass filter may have multiple passbands in certain special cases, as would be appreciated by one skilled in the art, although for simplicity of explanation, it will be assumed throughout this description that each band pass filter has one passband.

Of the at least two signal paths, at least one signal path (e.g., first signal path) includes a first filtering device and a series inductance positioned between the respective first filtering device and the common antenna port. The first filtering device includes one or more first band pass filters. At least one other signal path (e.g., at least one second signal path) is connected to the common antenna port, bypassing the series inductance of the first signal path. The at least one second signal path includes a corresponding at least one second filtering device, configured such that a total of at least two second band pass filters from one or more of the at least one second filtering device are connected to the common antenna port, bypassing the series inductance of the first signal path. For example, there may be two second signal paths and two corresponding second filtering devices, each of which includes a second band pass filter connected to the common antenna port. Alternatively, there may be one second signal path and one corresponding second filtering device which includes two second band pass filters connected to the common antenna port. Regardless, each second band pass filter provides a capacitive load in the passband(s) of the other second band pass filter(s), respectively.

For example, in a basic embodiment where there are three signal paths (as shown in FIG. 1, for example), a first signal path includes the series inductance and a first band pass filter "indirectly connected" to the common antenna port through the series inductance, and two second signal paths include corresponding second band pass filters "directly connected" to the common antenna port, bypassing the series inductance. For each second signal path, an effect of parasitic inductance and capacitance of the corresponding direct connection on the input impedance of this second signal path, when viewed from the common antenna port, alters the input impedance of this second signal path by no more than approximately 25 percent in the passband frequency range of the first band pass filter. The series inductance is used for shunt matching for the directly connected second band pass filters. In alternative embodiments, there may be more than one first signal paths with corresponding first band pass filters and series inductances between the first band pass filters and the common antenna port, respectively.

Figure 2:
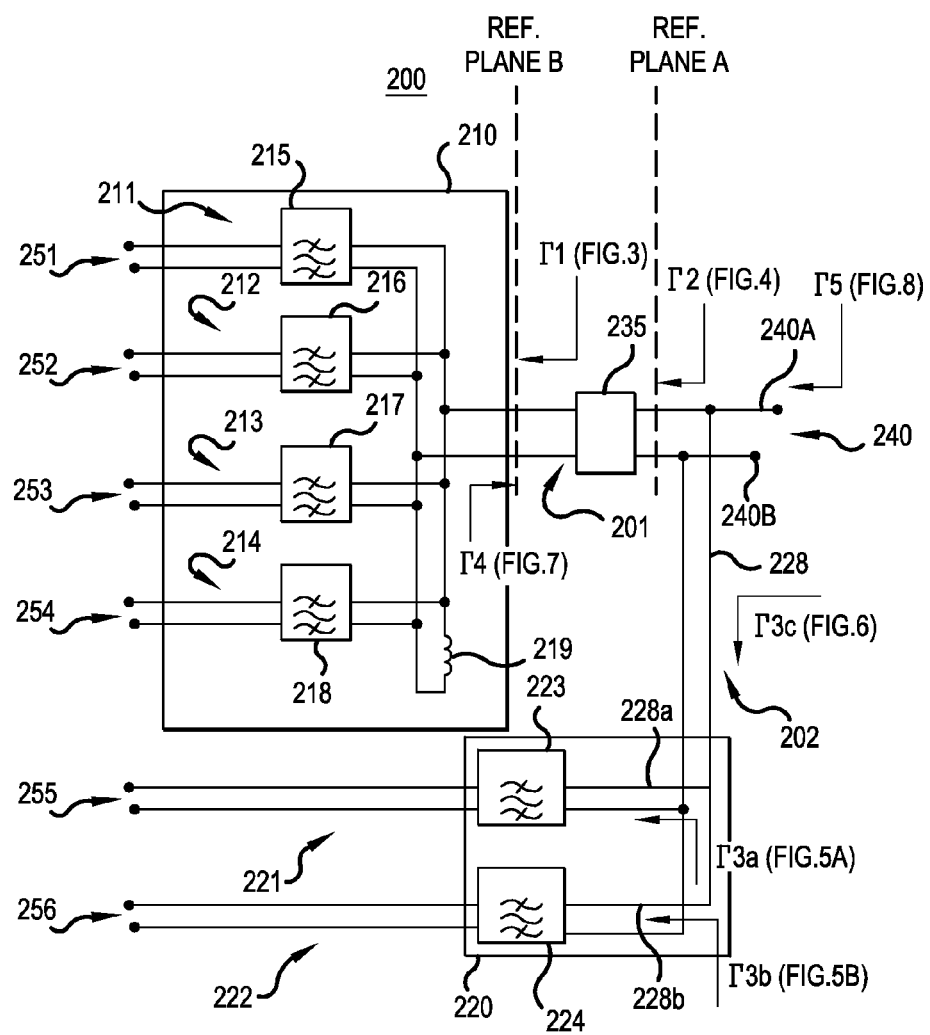
FIG. 2 is a simplified block diagram of a multiplexer device connected to a common port, according to a representative embodiment.

In other illustrative embodiments, the first filtering device may be a prematched multiplexer, such as a quadplexer (as shown in FIG. 2, for example), which provides a first signal path. The multiplexer includes multiple signal branches of the first signal path with corresponding ports and first band pass filters, and is connected to a series inductance at the single multiplexer port. That is, the series inductance is common to all of the first band pass filters within the first filtering device. Generally, "prematched" may refer to a multiplexer having an additional matching component, such as a series or shunt inductor (as shown by shunt inductor 219 in FIG. 2, for example).

In various embodiments, the multiple device may include just one second filtering device, which is a multiplexer that includes at least two second band pass filters connected to the common antenna port. In various alternative embodiments, there may be more than one second filtering devices, each of which may be a multiplexer or band pass filter, for example, and provides at least one second band pass filter connected to the common antenna port.

The various embodiments build on the fact that an acoustic band pass filter has input impedance that is dominated by a capacitance, and therefore can be approximated by that capacitance in regions in which acoustical behavior is low and thus acoustics can be ignored. The input impedance is dominated by the capacitance typically over the entire frequency range of the acoustic band pass filter, except for the frequency region around the filter passband. Notably, inductive parasitics may further alter the input impedance at high frequencies, although such effects are typically well above the frequency range of interest. Consequently, the input impedance of an acoustic band pass filter, apart from its passband, is capacitive and therefore will decrease with increasing frequency.

FIG. 1 is a simplified block diagram of a multiplexer device connected to a common port, according to a representative embodiment.

Referring to FIG. 1, multiplexer device 100 includes one first signal path 111 and two second signal paths 121 and 122 connected to a common port 140 (e.g., common antenna port). The first signal path 111 includes first band pass filter 115 (i.e., a first filtering device) with a first pass band, and an inductance 135 connected in series between the first band pass filter 115 and the common port 140. The second signal paths 121 and 122 include second band pass filters 123 and 124 (i.e., two second filtering devices) with corresponding second pass bands, respectively. The series inductance 135 may be provided by a transmission line (e.g., with high reference impedance) and one or more series inductors. Of course, the series inductance 135 may be provided only by a transmission line with high reference impedance (and no series inductors). Generally, the high reference impedance is higher than a reference impedance of the common port 140, for example. Of course, the combinations for providing the appropriate value of the series inductance 135, including an appropriate impedance of a high reference impedance transmission line, may vary to meet application specific design requirements of various implementations, as would be apparent to one skilled in the art. The multiplexer device 100 also includes a connection point 136 for connecting each of the second band pass filters 123 and 124 to the common port 140, bypassing the series inductance 135.

Each of the first band pass filter 115 and the second band pass filters 123 and 124 may be an acoustic filter, comprising multiple acoustic resonators, such as bulk acoustic wave (BAW) resonators. Examples of BAW resonators for filtering the receive and transmit signals include solidly mounted resonators (SMRs) and thin film bulk acoustic resonators (FBARs). For example, each of the first band pass filter 115 and the second band pass filters 123 and 124 may be a ladder filter comprising a plurality of series connected BAW resonators and a plurality of shunt connected BAW resonators, as would be apparent to one skilled in the art.

FIG. 1 shows a basic embodiment in that at least one first signal path (e.g., first signal path 111) is needed for impedance matching of at least two second signal paths (e.g., second signal paths 121 and 122), as discussed below. Depending on implementation, each of the first signal path 111 and the second signal paths 121 and 122 may be a transmit signal path for passing filtered signals from a transmitter (not shown) to the common port 140, a receive signal path for passing filtered signals from the common port 140 to a receiver (not shown), or a time division duplex (TDD) signal path capable of transmitting and receiving.

In addition, each of the first band pass filter 115 and the second band pass filters 123 and 124 has a corresponding passband. The respective passbands of the first band pass filter 115 and the second band pass filters 123 and 124 are non-overlapping, meaning that the corresponding frequency ranges of the passbands do not include frequencies that also appear in any of the other passbands (i.e., they do not overlap). In an embodiment, the non-overlapping passband of the first band pass filter 115 may be lower in frequency than the non-overlapping passbands of the second band pass filters 123 and 124.

The series inductance transformed input impedance of the first band pass filter 115 is inductive, when viewed from the common port 140, in the passbands of the second band pass filters 123 and 124. Also, each one of the second band pass filters 123 and 124 is configured to provide a corresponding capacitive load at the common port 140 in the passband of the other one of the second band pass filters 124 and 123. Therefore the series inductance transformed input impedance of the first band pass filter 115 provides matching between the second band pass filters 123 and 124 and the common port 140 in the corresponding passbands of the second band pass filters 123 and 124. Accordingly, no shunt inductor needs to be connected to the common port 140 to match the second band pass filters 123 and 124 directly connected to the common port 140. That is, the transformed input impedance of the first band pass filter 115 when viewed from reference plane "A" is inductive and is acting as a distributed shunt inductor of the second band pass filters 123 and 124. When there is more than one first filtering device, the combined series inductance transformed input impedance of all of the first filtering devices is inductive, when viewed from the common port 140 (or reference plane "A"), in the passbands of the second band pass filters 123 and 124, and provides the matching, discussed above.

At the same time, the first band pass filter 115 sees a load impedance at reference plane "B," which is the port impedance of the common port 140 (e.g., the antenna impedance) loaded by the combined input impedance of the second signal paths, and subsequently transformed by the series inductance 135. Thereby, the combined input impedance of the second filtering devices, i.e., the band pass filters 123 and 124, is capacitive and not an open, when viewed from the common port 140, in the passband of the first band pass filter 115. The value of this capacitance is substantial, as discussed below. In an embodiment including multiple first filtering devices and corresponding series inductances, or a first filtering device being a multiplexer having multiple first band pass filters, connected in series with the series inductance 135, the combined input impedance of the second signal paths is substantially capacitive and not an open in at least a first passband of at least a respective first filtering device. This includes the combined input impedance of the second signal paths being substantially capacitive and not an open in up to all of the first passbands of the respective first filtering devices.

Referring to FIG. 1, the capacitive loading of the combined impedance of the band pass filters 123 and 124 is substantial, when viewed from the common port 140, as mentioned above. For example, the capacitive reactance of the load is less than about five times the reference impedance of the common port 140 in the respective passband of the first band pass filter 115 (the first filtering device). The load impedance at reference plane "B" of the first band pass filter 115 is typically a somewhat lower resistive impedance, relative to the reference impedance of the common port 140, but slightly inductive impedance in the first passband of the first band pass filter 115. Accordingly, the first band pass filter 115 in the first signal path 111 is matched to this load impedance.

As mentioned above, the first band pass filter 115 (the first filtering device) may be described as being indirectly connected to the common port 140 due to placement of the series inductance 135 between the first band pass filter 115 and the common port 140, while each of the second band pass filters 123 and 124 may be described as being directly connected to the common port 140 since the series inductance 135 is bypassed. Of course, the second band pass filters 123 and 124 connect to the common port 140 via relatively short transmission lines 128a and 128b, respectively, and relatively short transmission line 128, which all provide some electrical delay and have some associated inductance and capacitance. However, this associated inductance is relatively low, as compared to the inductance provided by the series inductance 135. Thus, to be considered directly connected, the effect of parasitic inductance and capacitance of the direct connection via the transmission lines 128a, 128b and 128 on the individual input impedances of the second band pass filters 123 and 124, when viewed from the common port 140, alters these individual input impedances by no more than approximately 25 percent in the passband frequency range of the first filtering device.

In accordance with the depicted embodiment, only one matching element is required to match at least three filters (first band pass filter 115 and second band pass filters 123, 124) at a common port 140, and no shunt inductance connected between the common port 140 and ground is required, reducing space requirements for implementation. Unlike conventional shunt inductor matching circuits, only the other directly connected filtering devices (second band pass filters 123, 124) capacitively load the common port 140 in the passband of one directly connected filtering device, thereby reducing stored energy and reducing losses. Further, the first band pass filter 115 connected to the common port 140 through the series inductance 135 typically sees a transformed load impedance (e.g., antenna impedance) of the common port 140 at the reference plane B that is inductive. This improves filter design options of the first band pass filter 115, since this inductance may be used to compensate for capacitance in the first band pass filter 115, improving bandwidth and/or reducing losses.

The multiplexer device 100 may alternatively be described as including a common port 140, a first signal path 111 comprising a first port 151, a first band pass filter 115 (having a first passband) and a series inductance 135, a second signal path 121 comprising a second port 152 and a second band pass filter 123 (having a second passband), and a third signal path 122 comprising a third port 153 and a third band pass filter 124 (having a third passband). The first band pass filter 115 may be considered a first filtering device, and the second and third band pass filters 123 and 124 may be considered second filtering devices. The first passband, the second passband and the third passband are non-overlapping. The series inductance 135 is connected in series between the first band pass filter 115 and the common port 140. Thus, the first band pass filter 115 is indirectly connected to the common port 140 via the series inductance 135, and each of the second and third band pass filters 123 and 124 is directly connected to the common port 140, bypassing the series inductance 135, via transmission lines 128a and 128b, respectively, and transmission line 128.

The series inductance transformed input impedance of the first band pass filter 115 is inductive, when viewed from the common port 140 (or reference plane "A"), in each of the second and third passbands. The second band pass filter 123 provides a capacitive load at the common port 140 in the third passband of the third band pass filter 124, and the third band pass filter 124 provides a capacitive load at the common port 140 in the second passband of the second band pass filter 123, providing a common load input impedance of the second and third band pass filters 123 and 124 at the common port 140. The combined input impedance of the second band pass filter 123 and the third band pass filter 124 is substantially capacitive and not an open, when viewed from the common port 140, in the passband of the first band pass filter 115 (or in all passbands of (multiple) first band pass filters 115, as discussed below). The series inductance 135 enables an impedance of the second band pass filter 123 to match an impedance of the common port 140 in the second passband, and an impedance of the third band pass filter 124 to match the impedance of the common port 140 in the third passband, eliminating a need for a shunt inductance connected between the common port 140 and ground.

As mentioned above, FIG. 1 depicts a basic representative embodiment, having one first signal path (e.g., first signal path 111) for impedance matching of two second signal paths 121 and 122. However, alternative embodiments may include one or more first signal paths and corresponding first filtering devices and one or more second signal paths and corresponding one or more second filtering devices (such that a total of at least two second band pass filters from the one or more second filtering devices are connected to the common antenna port) may be incorporated, without departing from the scope of the present teachings. An example of various signal paths and filtering devices is discussed below with reference to FIG. 2.

FIG. 2 is a simplified block diagram of a multiplexer device connected to a common port, according to a representative embodiment.

Referring to FIG. 2, multiplexer device 200 includes a first signal path 201, comprising a first filtering device 210 (i.e., a quadplexer, for purposes of illustration) and series inductance 235 connected to a common antenna port 240, and a second signal path 202, comprising second filtering device 220 (i.e., a duplexer, for purposes of illustration) connected directly to the common antenna port 240 (that is, bypassing the series inductance 235). The first signal path 201 and the second signal path 202 enable RF signal communications through an antenna (not shown) connected to the common antenna port 240.

The first filtering device 210 includes multiple (e.g., four) first signal branches having corresponding first band pass filters in one first signal path 201. That is, first signal branch 211 includes differential port 251 and first band pass filter 215, first signal branch 212 includes differential port 252 and first band pass filter 216, first signal branch 213 includes differential port 253 and first band pass filter 217, and first signal branch 214 includes differential port 254 and first band pass filter 218. The first filtering device 210 further includes inductor 219, which is configured to provide matching in between the signal branches 211-214. That is, the inductor 219 prematches the first filtering device 210, i.e. the four first signal branches 211-214 with corresponding first band pass filters 215-218. Therefore, the first signal path 201 includes differential ports 251-254, the first filtering device 210 and the series inductance 235.

In the depicted configuration, the second filtering device 220 includes multiple (e.g., two) second signal branches having corresponding second band pass filters in one second signal path 202. That is, second signal branch 221 includes differential port 255 and second band pass filter 223, and the second signal branch 222 includes differential port 256 and second band pass filter 224. In alternative configurations, the second band pass filters 223 and 224 may be considered to be two second filtering devices that are part of two second signal paths, respectively. In this configuration, the clustering of the two second band pass filters 223 and 224 to a duplexer defining the second filtering device 220 as shown in FIG. 2 is not done. Regardless, the analysis is substantially the same, as would be apparent to one of ordinary skill in the art.

In the depicted example, the first band pass filters 215 and 216 may be transmit and receive filters for LTE band 3, and the first band pass filters 217 and 218 may be transmit and receive filters for LTE band 1. Also, the second band pass filters 223 and 224 may be transmit and receive filters at LTE band 7. It is understood that various alternative embodiments may include different numbers of first and second signal paths and corresponding first and second filtering devices and/or band pass filters (with a minimum of one first signal path/first band pass filter and a minimum of one second signal paths/two second band pass filters, as discussed above), without departing from the scope of the present teachings. Likewise, the various first and second band pass filters may have respective passbands directed to other frequency ranges (e.g., other than those corresponding to bands 1, 3 and 7), without departing from the scope of the present teachings.

In depicted embodiment, first signal branches 211-214 (in the first filtering device 210) of the first signal path 201 and second signal branches 221-222 (in the second filtering device 220) may carry differential signals between differential ports 251-256, respectively, and differential common antenna port 240. Accordingly, each of the differential ports 251-256 includes a pair of terminals, and each of the signal branches 211-214 and the second signal branches 221-222 includes a pair of connections, as shown in FIG. 2. The differential common antenna port 240 likewise includes a pair of terminals (terminals 240A and 240B). In a differential application, the pairs of terminals are accordingly connected to differential sources/ports. Alternatively, one terminal of each of the differential ports 251-256 and the common antenna port 240 may be connected to a common reference potential, such as a ground plane, thereby effectively turning the differential circuit into a single ended circuit, in which case, the other terminal of each of the differential ports 251-256 and the common antenna port 240 provide the main signal path via the corresponding first signal branches 211-214 and second signal branches 221-222.

Each of the first band pass filters 215-218 and the second band pass filters 223-224 may be an acoustic resonator filter and/or a ladder filter, comprising multiple acoustic resonators, such as BAW resonators, as discussed above. Also, in alternative embodiments, the first signal branches 211-214 and the second signal branches 221-222 may be various combinations of transmit, receive and TDD signal paths, without departing from the scope of the present teachings.

Further, each of the first band pass filters 215-218 and the second band pass filters 223-224 has a corresponding passband. The passbands of the first band pass filters 215-218 and the second band pass filters 223-224 are non-overlapping. In an embodiment, all of the non-overlapping passbands of the first band pass filters 215-218 may be lower in frequency than the non-overlapping passbands of the second band pass filters 223 and 224, although other embodiments are not limited to this configuration.

The combined input impedance of the input impedance of the filtering device 210 transformed by the series inductance 235 is inductive, when viewed from the common antenna port 240 (or reference plane "A"), in the passbands of the second band pass filters 223-224. This combined inductive input impedance provides matching between the second band pass filters 223 and 224 and the common antenna port 240 in the corresponding passbands of the second band pass filters 223 and 224. Accordingly, no shunt inductor needs to be connected to the common antenna port 240 to match the second band pass filters 223 and 224 directly connected to the common antenna port 240. That is, the combined and series inductance transformed inductive input impedance of the first filtering device 210 acts as a distributed shunt inductor of the second band pass filters 223 and 224. At the same time, the first filtering device 210 may see a shunt capacitive (C)— series inductive (L) circuit, which transforms the impedance at the common antenna port 240 (e.g., the antenna impedance) into a somewhat lower resistive, typically slightly inductive impedance at reference plane B. Accordingly, the first filtering device 210 is matched to this transformed impedance.

Meanwhile, as discussed above with reference to FIG. 1, the input impedance of the second filtering device 220, which is formed by the combined input impedance of the second band pass filters 223 and 224 in FIG. 2, is substantially capacitive and not an open, when viewed from the common antenna port 240, in the passbands of the first band pass filters 215-218. Also, each one of the second band pass filters 223 and 224 is configured to provide a corresponding capacitive load at the common antenna port 240 in the passband of the other one of the second band pass filters 224 and 223.

As mentioned above, the first filtering device 210 formed by the first band pass filters 215-218 and the inductor 219 may be described as being indirectly connected to the common antenna port 240 due to placement of the series inductance 235 between the first filtering device 210 and the common antenna port 240, while each of the second band pass filters 223 and 224 may be described as being directly connected to the common antenna port 240 since the series inductance 235 is bypassed. The second band pass filters 223 and 224 connect to the common antenna port 240 via transmission line 228 and transmission lines 228a and 228b, respectively. In various embodiments, the transmission lines 228, 228a and 228b have relatively low inductances, particularly as compared to the inductance provided by the series inductance 235, and thus the second band pass filters 223 and 224 may still be considered directly connected to the common antenna port 240, e.g., so long as the effect of parasitic inductance and capacitance of the direct connection via the transmission line 228 (as well as transmission lines 228a and 228b, respectively) on the input impedance of each of the second band pass filters 223 and 224, when viewed from the common antenna port 240, alters the individual input impedances by no more than approximately 25 percent in the passbands of the first band pass filters 215-218, as mentioned above.

In accordance with the depicted embodiment, one matching element is required to match the first filtering device 210 (including first band pass filters 215-218 and the inductor 219) and second filtering device 220 (including second band pass filters 223-224) at a common antenna port 240, reducing space requirements for implementation. In addition, the first filtering device 210 is prematched, and thus uses a second matching element, inductor 219. Also, only the directly connected second band pass filters 223, 224 capacitively load the common antenna port 240, thereby reducing stored energy in matching circuitry and reducing losses. Further, the first filtering device 210 connected to the common antenna port 240 by the series inductance 235 typically sees a transformed load impedance (e.g., antenna impedance) at the common antenna port 240 that is inductive. This improves filter design options of the first band pass filters 215-218, as discussed above.

FIGS. 3 to 7 are Smith Charts showing impedance as viewed from various locations in the multiplexer device 200, according to a representative embodiment. More particularly, FIGS. 3 to 7 correspond to impedances as viewed from locations gamma 1 (Γ1) through Γ5, corresponding to various reference planes, shown in FIG. 2.

Figure 3:
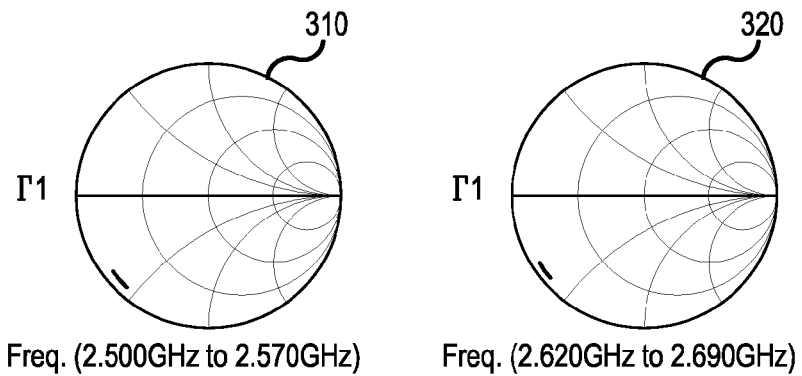
FIG. 3 provides Smith Charts illustrating input impedance of a quadplexer in the multiplexer device shown in FIG. 2, according to a representative embodiment.

FIG. 3 includes Smith Charts 310 and 320, which show input impedances of the first filtering device 210 at LTE band 7 (as viewed from Γ1 in FIG. 2). LTE band 7 are the passband frequencies of the second band pass filters 223 and 224, in the present example. In particular, Smith Chart 310 shows a capacitive input impedance in the uplink frequency band of 2.500 GHz-2.570 GHz, and Smith Chart 320 shows a capacitive input impedance in the downlink frequency band of 2.620 GHz-2.690 GHz.

Figure 4:
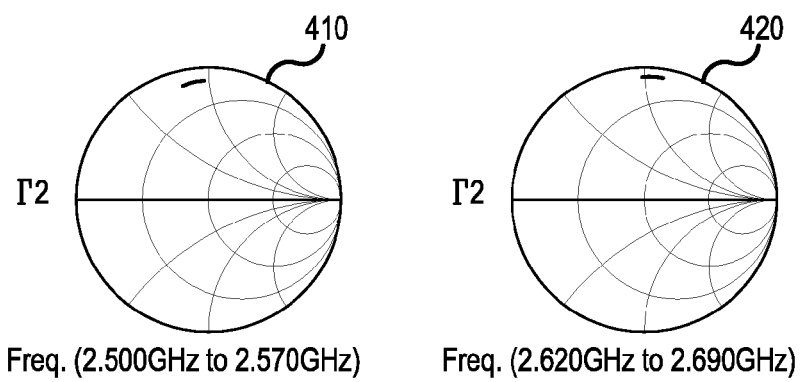
FIG. 4 provides Smith Charts illustrating series inductance transformed input impedance of a quadplexer in the multiplexer device shown in FIG. 2, according to a representative embodiment.

FIG. 4 includes Smith Charts 410 and 420, which show series inductance transformed input impedances of the first filtering device 210 at LTE band 7 (as viewed from Γ2 in FIG. 2). In particular, Smith Chart 410 shows an inductive input impedance in the uplink frequency band of 2.500 GHz-2.570 GHz, and Smith Chart 420 shows an inductive input impedance in the downlink frequency band of 2.620 GHz-2.690 GHz, as transformed by the series inductance 235.

Figures 5A, 5B:
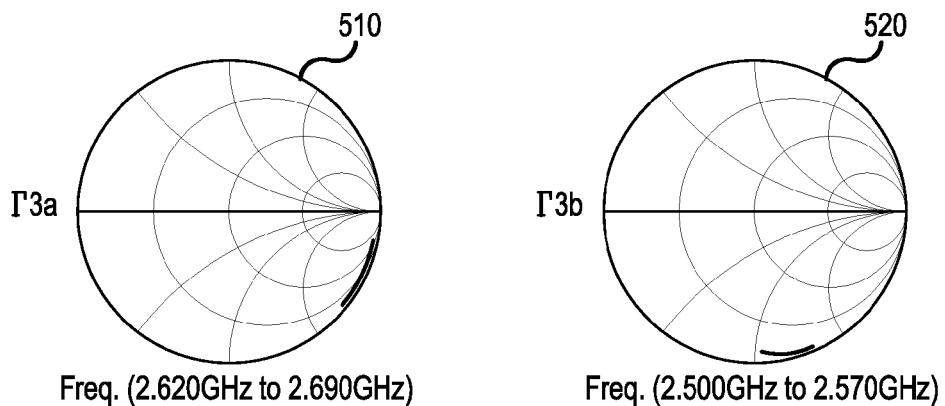
FIGS. 5A and 5B provide Smith Charts illustrating input impedances of the filters of the directly connected filtering device in the multiplexer device shown in FIG. 2, according to a representative embodiment.

FIGS. 5A and 5B include Smith Charts 510 and 520, respectively, which show input impedances of the second band pass filter 223 and the second band pass filter 224 in one another's passbands. That is, Smith Chart 510 shows input impedance of the second band pass filter 223 in the downlink frequency band at LTE band 7 (as viewed from Γ3a in FIG. 2), and Smith Chart 520 shows input impedance of the second band pass filter 224 in the uplink frequency band at LTE band 7 (as viewed from Γ3b in FIG. 2). In particular, Smith Chart 510 shows a capacitive input impedance in the downlink frequency band of 2.620 GHz-2.690 GHz in the second band pass filter 223, and Smith Chart 520 shows a capacitive input impedance in the uplink frequency band of 2.500 GHz-2.570 GHz in the second band pass filter 224.

Figure 6:
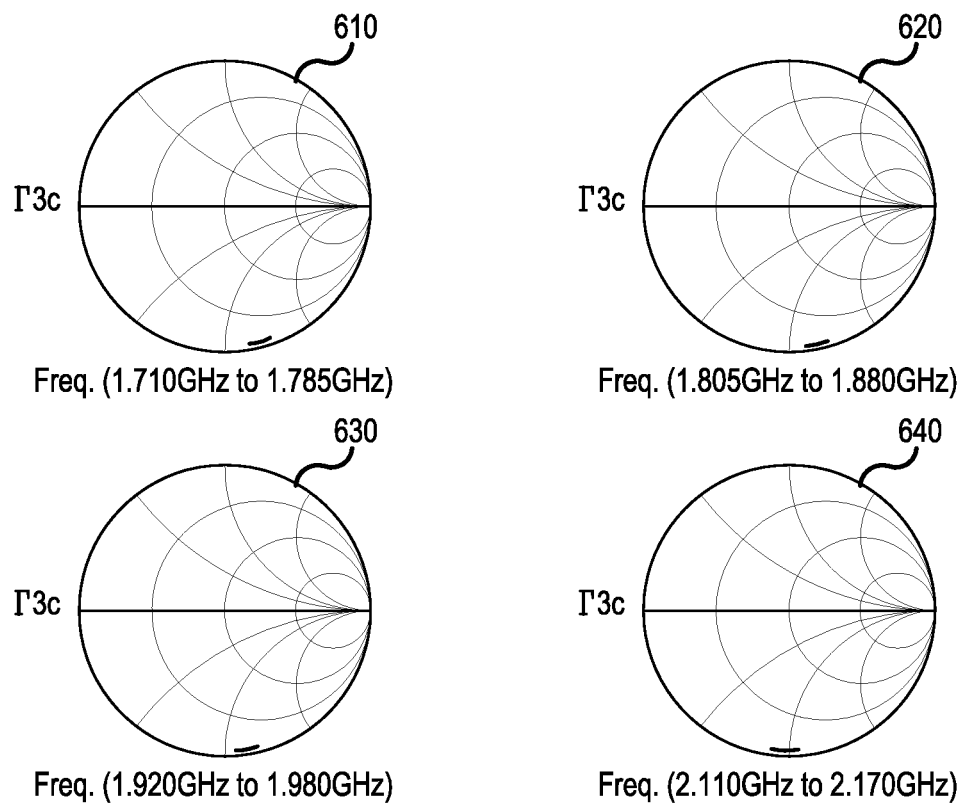
FIG. 6 provides Smith Charts illustrating combined input impedance of directly connected filtering device shown in FIG. 2, according to a representative embodiment.

FIG. 6 includes Smith Charts 610, 620, 630 and 640, which show combined input impedance of the second filtering device (e.g., second band pass filters 223-224) being substantially capacitive, when viewed from the common antenna port 240 (e.g., Γ3c in FIG. 2), in the passbands of the first filtering device 210, that is, LTE bands 3 and 1, respectively. In particular, Smith Chart 610 shows a substantially capacitive input impedance in the uplink frequency band of 1.710 GHz-1.785 GHz, and Smith Chart 620 shows a substantially capacitive input impedance in the downlink frequency band of 1.805 GHz-1.880 GHz, at LTE band 3. Similarly, Smith Chart 630 shows a substantially capacitive input impedance in the uplink frequency band of 1.920 GHz-1.980 GHz, and Smith Chart 640 shows a substantially capacitive input impedance in the downlink frequency band of 2.110 GHz-2.170 GHz, at LTE band 1. Notably, each of these input impedances indicates a substantially capacitive load as opposed to an open. An open is basically the point with coordinates (1, 0) in a Smith Chart. Generally, a region around this point, which is described by a magnitude of impedance (considering resistance and reactance) larger than about five times the reference impedance, and may be considered as an open. The reference impedance (in the context of combined input impedance) may be an average impedance of the antenna port to which a multiplexer is matched in the respective passbands of all first and second filters.

Figure 7:
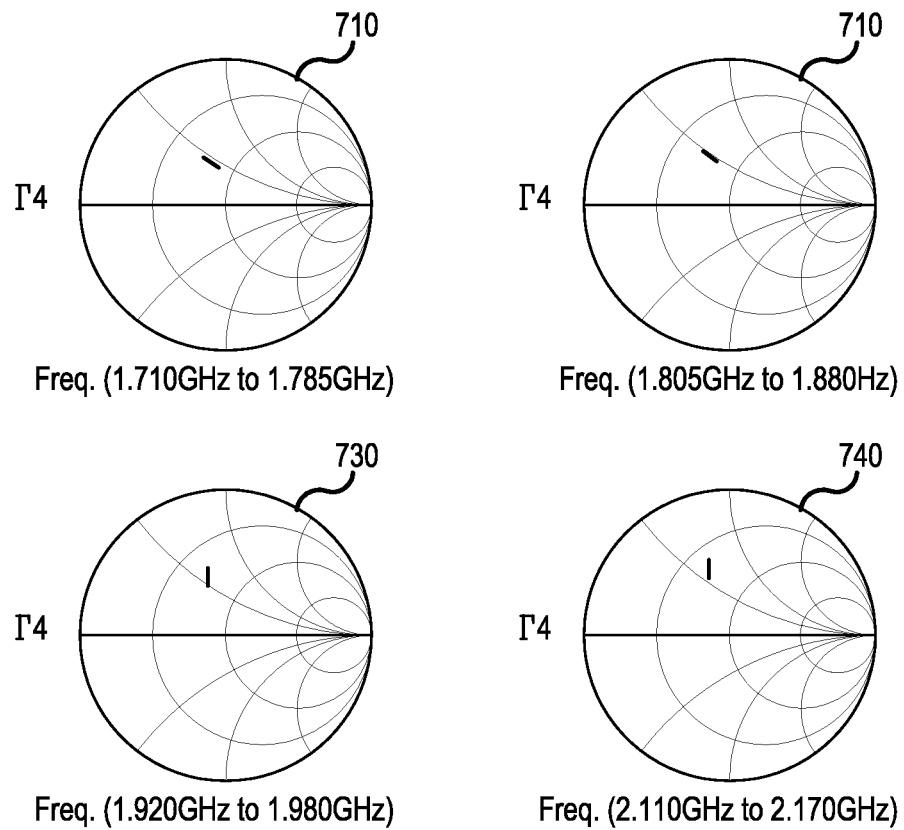
FIG. 7 provides Smith Charts diagram illustrating antenna port/reference impedance loaded by directly connected filtering device and transformed by the series inductance in the multiplexer device shown in FIG. 2, and therefore the load impedance for the quadplexer, according to a representative embodiment.

FIG. 7 includes Smith Charts 710, 720, 730 and 740, which show the antenna port terminated by its reference impedance, loaded by directly connected band pass filters 223 and 224, and transformed by series inductance 235 in the multiplexer device 200 shown in FIG. 2, and therefore the load impedance for first filtering device 210, according to a representative embodiment (as viewed from F4 in FIG. 2). In particular, Smith Chart 710 shows a transformed antenna impedance which is inductive in the uplink frequency band of 1.710 GHz-1.785 GHz, and Smith Chart 720 shows a transformed antenna impedance which is inductive in the downlink frequency band of 1.805 GHz-1.880 GHz, at LTE band 3. Similarly, Smith Chart 730 shows a transformed antenna impedance which is inductive in the uplink frequency band of 1.920 GHz-1.980 GHz, and Smith Chart 740 shows a transformed antenna impedance which is inductive in the downlink frequency band of 2.110 GHz-2.170 GHz, at LTE band 1.

Figure 8:
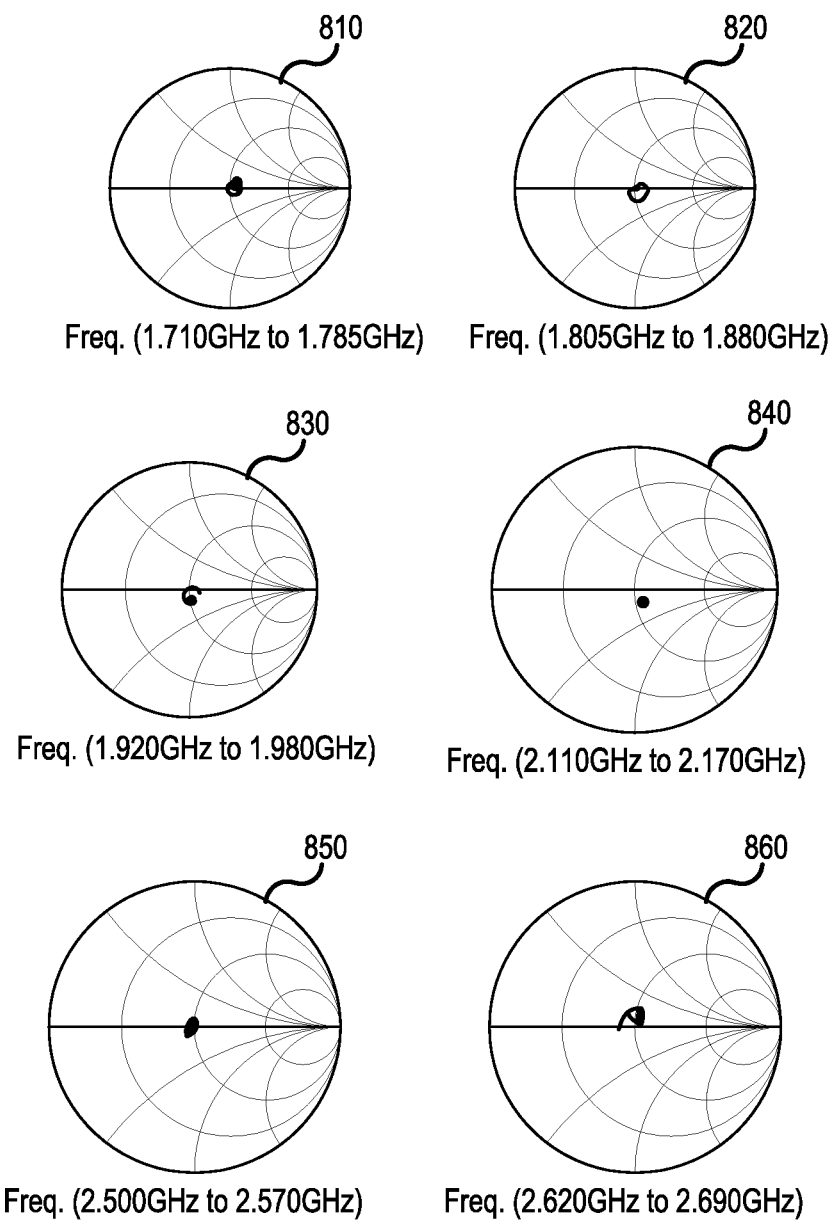
FIG. 8 provides Smith Charts showing input impedance of the multiplexer viewed through the antenna port in passbands of respective first and second band pass filters shown in FIG. 2, according to a representative embodiment.

FIG. 8 is a Smith Chart showing input impedance of the multiplexer device 200 viewed through the common antenna port 240 (or matched antenna impedance) in passbands of respective first band pass filters 215-218 and second band pass filters 223-224 in the multiplexer device 200, according to a representative embodiment.

In particular, Smith Chart 810 shows input impedance in the uplink frequency band of 1.710 GHz-1.785 GHz of the first band pass filter 215, and Smith Chart 820 shows input impedance in the downlink frequency band of 1.805 GHz-1.880 GHz of the first band pass filter 216, at LTE band 3. Likewise, Smith Chart 830 shows input impedance in the uplink frequency band of 1.920 GHz-1.980 GHz of the first band pass filter 217, and Smith Chart 840 shows input impedance in the downlink frequency band of 2.110 GHz-2.170 GHz of the first band pass filter 218, at LTE band 1. Also, Smith Chart 850 shows input impedance in the uplink frequency band of 2.500 GHz-2.570 GHz of the second band pass filter 223, and Smith Chart 860 shows input impedance in the downlink frequency band of 2.620 GHz-2.690 GHz of the second band pass filter 224, at LTE band 7. In other words, antenna matching is provided for each of the first signal path 201 and the second signal path 202 according to the representative embodiment.

Figure 9:
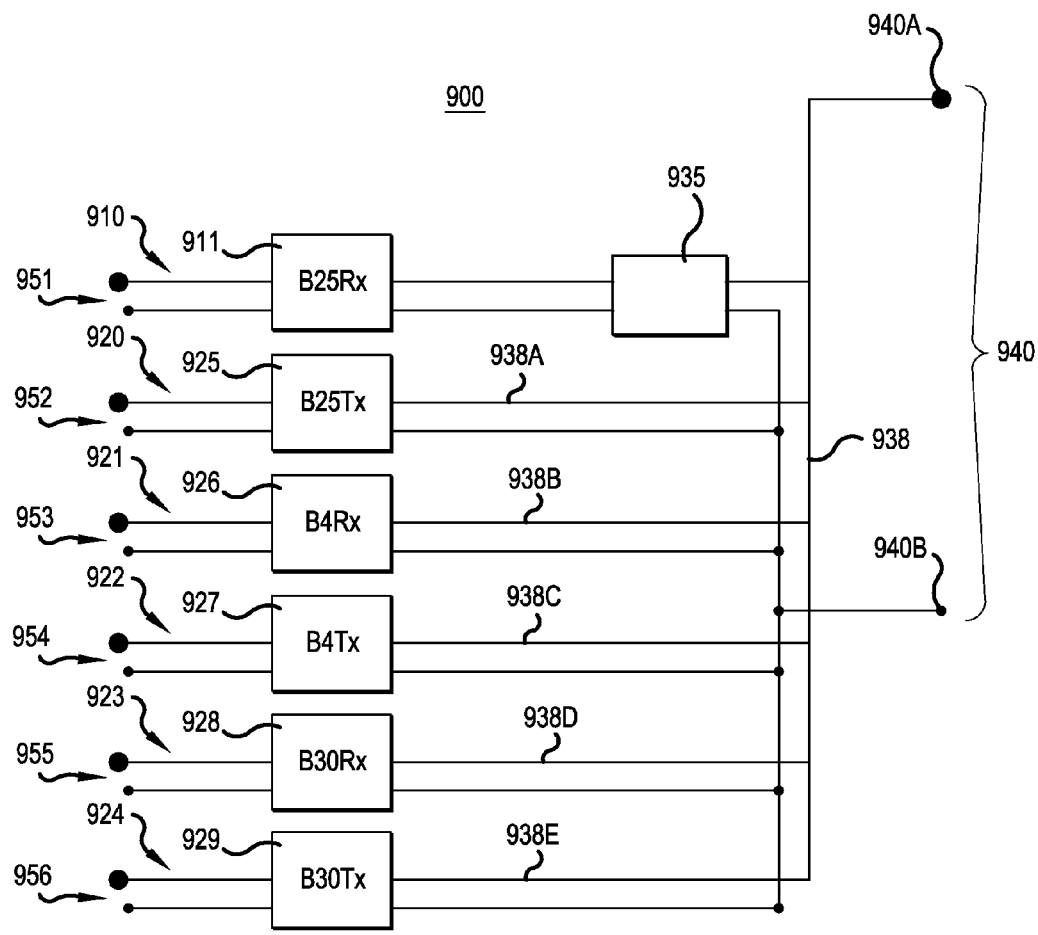
FIG. 9 is a simplified block diagram of a multiplexer device connected to a common port, according to a representative embodiment.

FIG. 9 is a simplified block diagram of a multiplexer device connected to a common port, according to a representative embodiment.

Referring to FIG. 9, multiplexer device 900 is a single multiplexer in which one of the multiple signal paths includes a series inductance, such that the corresponding filtering device formed by a band pass filter is indirectly connected to a common antenna port through the series inductance. The remaining signal paths do not include the series inductance, and thus the corresponding band pass filters, each defining a second filtering device, are directly connected to the common antenna port, bypassing the series inductance. The multiplexer device 900 may be a mobile communication device, for example. A first filtering device that is a first band pass filter 911 may be described as being indirectly connected to the common antenna port 940 due to placement of the series inductance 935 between the first band pass filter 911 and the common antenna port 940, while each of second band pass filters 925-929 may be described as being directly connected to the common antenna port 940 since the series inductance 935 is bypassed, as discussed above with reference to FIGS. 1 and 2.

In alternative embodiments, one or more additional band pass filters of the depicted band pass filters 925-929 may be connected to the common antenna port 940 through a series inductance (i.e., in addition to the first band pass filter 911), reducing the number of second band pass filters and increasing the number of first band pass filters, without departing from the scope of the present teachings. In such a configuration, the additional first band pass filter(s) may be connected to the common antenna port 940 through a corresponding series inductance (not shown), different from the series inductance 935, connected between the additional first band pass filter(s) and the common antenna port, thus defining an additional first filtering device(s). Alternatively, the additional first band pass filter(s) may be connected to the common antenna port 940 through the same series inductance 935 shown in FIG. 9, thus forming a first filtering device together with the first band pass filter 911.

The multiplexer device 900 includes first signal path 910, which includes the first band pass filter 911 and the series inductance 935 connected in series to the common antenna port 940. The series inductance 935 may result from inductance of the transmission line between the first band pass filter 911 or inductance of the transmission line plus inductance of one or more inductors (depending on implementation, as discussed above). The second signal paths 920-924 are connected to the common antenna port 940 through transmission line 938 and transmission lines 938A-938E, respectively. The first signal path 910 and the second signal paths 920-924 provide RF signal communications through an antenna (not shown) connected to the common antenna port 940. The first signal path 910 includes differential port 951, the first band pass filter 911 being the first filtering device and the series inductance 935. The second signal path 920 includes differential port 952 and the second band pass filter 925, the second signal path 921 includes differential port 953 and the second band pass filter 926, the second signal path 922 includes differential port 954 and the second band pass filter 927, the second signal path 923 includes differential port 955 and the second band pass filter 928, and the second signal path 924 includes differential port 956 and the second band pass filter 929.

In the depicted example, the first band pass filter 911 and the second band pass filter 925 are receive and transmit filters, respectively, at LTE band 25, such that the first signal path 910 is receive signal path for carrying signals from the common antenna port 940 to a receiver (not shown) via the differential port 951 and the second signal path 920 is a transmit signal path for carrying signals from a transmitter (not shown) via the differential port 952 to the common antenna port 940. The second band pass filters 926 and 927 are receive and transmit filters, respectively, at LTE band 4, such that the second signal path 921 is a receive signal path for carrying signals from the common antenna port 940 to a receiver (not shown) via the differential port 953 and the second signal path 922 is a transmit signal path for carrying signals from a transmitter (not shown) via the differential port 954 to the common antenna port 940. The second band pass filters 928 and 929 are receive and transmit filters, respectively, at LTE band 30, such that the second signal path 923 is a receive signal path for carrying signals from the common antenna port 940 to a receiver (not shown) via the differential port 955 and the second signal path 924 is a transmit signal path for carrying signals from a transmitter (not shown) via the differential port 956 to the common antenna port 940. As discussed above, each of the differential ports 951-956 includes a pair of terminals, as shown.

It is understood that various alternative embodiments may include different numbers of first and second signal paths and corresponding first and second filtering devices (with a minimum of one first signal path/first filtering device and a minimum of one second signal path and two second band pass filters, as discussed above, where the second band pass filters may be included in at least one second filtering device), without departing from the scope of the present teachings. Likewise, the various first filtering devices and second band pass filters may have respective passbands directed to other frequency ranges (e.g., other than those corresponding to LTE bands 4, 25 and 30), without departing from the scope of the present teachings.

In depicted embodiment, each of the differential ports 951-956 includes a pair of terminals, as mentioned above, and the first signal path 910 and the second signal paths 920-924 carry differential signals. Accordingly, each of the first signal path 910 and the second signal paths 920-924 includes two connections, as shown. In a differential application, the pairs of terminals of the differential ports 951-956 are accordingly connected to differential sources/ports. Alternatively, one terminal of each of the differential ports 951-956 and the common antenna port 940 may be connected to a common reference potential, such as a ground plane, thereby effectively turning the differential circuit into a single ended circuit. For example, the common antenna port 940 is depicted as a differential port, where a first terminal 940A may connect with the main signal path (to the antenna) and a second terminal 940B may connect to a ground reference plane.

Further, each of the first band pass filter 911 and the second band pass filters 925-929 has a corresponding passband. The passbands of the first band pass filter 911 and the second band pass filters 925-929 are non-overlapping.

Series inductance transformed input impedance of the first filtering device formed by the first band pass filter 911 is inductive, when viewed from the common antenna port 940, in the passbands of the second band pass filters 925-929. This inductive input impedance provides matching between the second band pass filters 925-929 and the common antenna port 940 in the corresponding passbands of the second band pass filters 925-929. Accordingly, no shunt inductor needs to be connected to the common antenna port 940 to match the second band pass filters 925-929 directly connected to the common antenna port 940. That is, the inductive input impedance of the first band pass filter 911 acts as a distributed shunt inductor of the second band pass filters 925-929. At the same time, the first band pass filter 911 may see a shunt capacitive (C)—series inductive (L) circuit, which transforms the impedance at the common antenna port 940 (e.g., the antenna impedance) into a somewhat lower, typically slightly inductive impedance. Accordingly, the first band pass filter 911 is matched to this transformed impedance.

In addition, as discussed above, the combined input impedance of the second filtering devices formed by the second band pass filters 925-929, respectively, is substantially capacitive and not an open when viewed from the common antenna port 940, in the passband of the first band pass filter 911. Also, each one of the second band pass filters 925-929 is configured to provide a corresponding capacitive load at the common antenna port 940 in the passband of the other ones of the second band pass filters 925-929.

Thus, in accordance with the depicted embodiment, only one matching element is required to match six filters (first band pass filter 911 and second band pass filters 925-929) at a common antenna port 940. Also, only each of the directly connected second band pass filters 925-929 capacitively load the common antenna port 940 in the passbands of the other directly connected second band pass filters 925-929, thereby reducing stored energy in matching circuitry and reducing losses. Further, the first band pass filter 911 typically sees a transformed load impedance (e.g., antenna impedance) at the common antenna port 940 that is inductive. This improves filter design options of the first band pass filter 911, as discussed above with reference to first filtering device 210 in FIG. 2, for example.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A multiplexer device, comprising:
at least one first filtering device, each of the at least one first filtering device comprising at least one first band pass filter, connected to a common port via at least one series inductance, respectively, the at least one first band pass filter having only one or non-overlapping passbands; and
at least one second filtering device, each of the at least one second filtering device comprising at least one second band pass filter such that a total of at least two second band pass filters are connected to the common port, the at least two second band pass filters having non-overlapping passbands, respectively,
wherein combined series inductance transformed input impedance of the at least one first filtering device is inductive, when viewed from the common port, in the passbands of the at least two second band pass filters connected to the common port, and
wherein combined input impedance of the at least one second filtering device is substantially capacitive, when viewed from the common port, in a passband of the at least one first band pass filter in the at least one first filtering device, each second band pass filter being configured to provide a corresponding capacitive load at the common port in the passbands of the other second band pass filters of the at least two second band pass filters.

2. The multiplexer device of claim 1, wherein the at least two second band pass filters of the at least one second filtering device are each connected to the common port, with no additional matching elements.

3. The multiplexer device of claim 1, wherein the inductive input impedance of the at least one first filtering device provides matching between the at least two second band pass filters connected to the common port and the common port in the passbands of the at least two second band pass filters connected to the common port.

4. The multiplexer device of claim 1, wherein the passband of each of the at least one first band pass filter does not overlap any of the non-overlapping passbands of the at least two second band pass filters.

5. The multiplexer device of claim 1, wherein the at least one first filtering device comprises a plurality of first filtering devices, each comprising at least one first band pass filter and being connected to the common port via a corresponding plurality of series inductances.

6. The multiplexer device of claim 1 wherein each of the only one or non-overlapping passbands of the at least one first band pass filter of the at least one first filtering device is lower in frequency than the non-overlapping passbands of the at least two second band pass filters connected to the common port.

7. The multiplexer device of claim 1, wherein the common port comprises an antenna port connected to an antenna for at least one of receiving and transmitting signals.

8. The multiplexer device of claim 1, wherein no shunt inductor is connected to the common port due to the combined inductive input impedance of the at least one first filtering device acting as a distributed shunt inductor for the at least one second filtering device.

9. The multiplexer device of claim 1, wherein the at least one series inductance is provided by a transmission line with high reference impedance.

10. The multiplexer device of claim 9, wherein the at least one series inductance is further provided by an inductor.

11. The multiplexer device of claim 1, wherein each of the at least one first band pass filter and the at least two second band pass filters comprises an acoustic filter.

12. The multiplexer device of claim 11, wherein each acoustic filter comprises a bulk acoustic wave (BAW) resonator.

13. The multiplexer device of claim 12, wherein each BAW resonator comprises one of a solidly mounted resonator (SMR) or a thin film bulk acoustic resonator (FBAR).

14. The multiplexer device of claim 1, wherein the combined input impedance of the at least one second filtering device is substantially capacitive, when viewed from the common port, in all passbands of the at least first band pass filter in the at least first filtering device.

15. A multiplexer device, comprising:
a common antenna port connected to an antenna for at least one of receiving and transmitting radio frequency (RF) signals;
a first signal path comprising a first port, a first filtering device including at least one first band pass filter having a corresponding at least one first passband, and an inductance connected in series between the first filtering device and the common antenna port;
a second band pass filter having a second passband;
a third band pass filter having a third passband, wherein the at least one first passband, the second passband and the third passband are non-overlapping,
wherein each of the second and third band pass filters is connected to the common antenna port, bypassing the series inductance, and
wherein input impedance of the first filtering device transformed by the series inductance is inductive, when viewed from the common antenna port, in each of the second and third passbands, and
wherein combined input impedance of the second and third band pass filters is substantially capacitive and not an open, when viewed from the common antenna port, in all of the at least one first passband of the at least one first band pass filter.

16. The multiplexer device of claim 15, wherein the second band pass filter provides a capacitive load at the common antenna port in the third passband of the third band pass filter, and the third band pass filter provides a capacitive load at the common antenna port in the second passband of the second band pass filter, providing a common load input impedance of the second and third band pass filters at the common antenna port.

17. The multiplexer device of claim 15, wherein the series inductance in the first signal path enables an impedance of the second band pass filter to match an antenna impedance of the common antenna port in the second passband, and an impedance of the third band pass filter to match the antenna impedance in the third passband, eliminating a need for a shunt inductance connected between the common antenna port and ground.

18. A multiplexer device, comprising:
a first filtering device comprising one or more first band pass filters indirectly connected to a common antenna port via an inductance connected in series between the first filtering device and the common antenna port, wherein the one or more first band pass filters have non-overlapping first passbands, respectively; and a second filtering device comprising a plurality of second band pass filters directly connected to the common antenna port, the second band pass filters having non-overlapping second passbands, respectively, wherein an effect of parasitic inductance and capacitance of the direct connection of each of the second band pass filters on the respective input impedance of each of the second band pass filters, when viewed from the common antenna port, alters the respective input impedance by no more than approximately 25 percent in first passband frequency ranges of the one or more first band pass filters, respectively, wherein a combined series inductance transformed input impedance of the first filtering device is inductive, when viewed from the common antenna, in the second passbands of the second band pass filters, and wherein a combined input impedance of the plurality of second band pass filters in the second filtering device is substantially capacitive, when viewed from the common port, in all of the first passbands of the at least one first band pass filters.

19. The multiplexer device of claim 18, wherein the first filtering device is a prematched multiplexer and further comprises a shunt inductor.

* * * * *